United States Patent
Donaldson et al.

[19]

[11] Patent Number: 6,057,733
[45] Date of Patent: May 2, 2000

[54] FEEDFORWARD MULTICARRIER LINEAR RF POWER AMPLIFIER

[75] Inventors: Jimmie L. Donaldson, Milford; Robert K. Montgomery, Neshanic; Robert E. Myer, Denville; Mohan Patel, Edison; Norman G. Ziesse, Chester, all of N.J.

[73] Assignee: Lucent Technologies, Inc., Murray Hill, N.J.

[21] Appl. No.: 08/993,682

[22] Filed: Dec. 18, 1997

[51] Int. Cl.[7] .................................................. H03F 1/32
[52] U.S. Cl. ........................................ 330/151; 455/126
[58] Field of Search ............................... 330/151, 149, 330/52; 455/114, 115, 126; 375/296, 297

[56] References Cited

U.S. PATENT DOCUMENTS

| | | | |
|---|---|---|---|
| 4,472,725 | 9/1984 | Blumenkranz | 330/149 |
| 4,625,178 | 11/1986 | Mannerstrom | 330/149 |
| 4,782,307 | 11/1988 | Hsu | 330/151 |
| 5,166,634 | 11/1992 | Narahashi et al. | 330/151 |
| 5,455,537 | 10/1995 | Larkin et al. | 330/52 |
| 5,523,716 | 6/1996 | Grebliunas et al. | 330/149 |
| 5,524,285 | 6/1996 | Wray et al. | 330/149 |
| 5,774,018 | 6/1998 | Gianfortune et al. | 330/52 |
| 5,789,978 | 8/1998 | Zhang et al. | 330/149 |
| 5,913,163 | 6/1999 | Johansson | 455/426 |

FOREIGN PATENT DOCUMENTS

| | | |
|---|---|---|
| 0 714 164 A2 | 5/1999 | European Pat. Off. . |
| 44 32 119 A1 | 3/1996 | Germany . |

*Primary Examiner*—Benny Lee
*Assistant Examiner*—Khanh Van Nguyen

[57] ABSTRACT

A modularly-partitioned feedforward multicarrier linear RF power amplifier is described. The circuitry and components of the power amplifier are segregated into physically-separate modules in accordance with several criteria. In one embodiment, the power amplifier is segregated into a RF power module, a linearizer module and a DC power supply module. The RF power module includes power- and frequency-dependent components and generally varies with the carrier frequency and output power requirements for a specific application. The linearizer module includes circuitry and components that are substantially power- and frequency-independent. As such, the linearizer module is substantially invariant and a single design may be used for virtually any application. The DC power supply module includes circuit and components that are substantially frequency independent but somewhat power dependent. The DC power supply module may vary from amplifier to amplifier where there is a significant change in output power requirements.

26 Claims, 3 Drawing Sheets

100

FEEDFORWARD MULTICARRIER LINEAR RF POWER AMPLIFIER

FIELD OF THE INVENTION

The present invention relates to telecommunications in general, and, more particularly, to an improved linear RF power amplifier.

BACKGROUND OF THE INVENTION

FIG. 1 depicts a schematic diagram of a portion of a typical wireless communications system in the prior art. Such a system provides wireless telecommunications service to a number of wireless terminals (e.g., wireless terminals 101-1 through 103-1) that are situated within a geographic region.

The heart of a typical wireless telecommunications system is Wireless Switching Center ("WSC") 120, which may also be known as a Mobile Switching Center ("MSC") or a Mobile Telephone Switching Office ("MTSO"). Typically, Wireless Switching Center 120 is connected to a plurality of base stations (e.g., base stations 103-1 through 103-5) that are dispersed throughout the geographic area serviced by the system. Additionally, Wireless Switching Center 120 is connected to local- and toll-offices (e.g., local-office 130, local-office 138 and toll-office 140). Wireless Switching Center 120 is responsible for, among other things, establishing and maintaining calls between wireless terminals and between a wireless terminal and a wireline terminal, which is connected to the system via the local and/or long-distance networks.

The geographic area serviced by a wireless telecommunications system is partitioned into a number of spatially-distinct areas called "cells." As depicted in FIG. 1, each cell is schematically represented by a hexagon; in practice, however, each cell usually has an irregular shape that depends on terrain topography. Typically, each cell contains a base station, which comprises radios and antennas that the base station uses to communicate with the wireless terminals in that cell and also comprises the transmission equipment that the base station uses to communicate with WSC 120.

For example, when wireless terminal 101-1 desires to communicate with wireless terminal 101-2, wireless terminal 101-1 transmits the desired information to base station 103-1, which relays the information to WSC 120. Upon receiving the information, and with the knowledge that it is intended for wireless terminal 101-2, WSC 120 then returns the information back to base station 103-1, which relays the information, via radio, to wireless terminal 101-2.

To relay information, the radio modulates the information onto a RF carrier signal in accordance with the particular modulation scheme of the wireless system (e.g., time-division-multiple-access, code-division-multiple-access, etc.). The modulated output RF signal from the radio is a very low power signal that requires amplification for transmission from base station 103-1 to wireless terminal 101-2.

A feedforward multicarrier linear RF power amplifier can be used to amplify the output signal from the radio. In fact, such an amplifier can usually amplify all of the RF carrier signals in use within a given cell. The design and operation of linear amplifiers are known in the art. See, for example, U.S. Pat. No. 5,304,945, which is incorporated by reference herein.

Unfortunately, conventional feedforward multicarrier linear RF power amplifiers are very complex and costly, both to design and manufacture. And, each application requires a custom design dictated by a variety of system requirements. Conventional feedforward multicarrier linear RF power amplifiers have been designed using a combination of RF circuits, analog control circuits and digital control circuits. A simplified schematic of linear amplifier circuit 200 is shown in FIG. 2. As depicted in FIG. 2, linear amplifier circuit 200 includes several splitters (202, 220), gain & phase control circuitry (204, 224), couplers (214, 216, 222, 228), delay circuitry (210, 218), a correction amplifier (226), pre-distortion driver circuitry (206), the main amplifier (208) and processor control circuitry (212).

The various circuits of a conventional linear amplifier are typically interspersed within a large housing that is designed to support the weight of the main amplifier, dissipate heat and prevent RF from radiating to the external environment. Additionally, the various individual circuits are housed in metal boxes or "clam shells" to provide RF isolation.

It would be desirable to reduce the cost and complexity of such amplifiers. Modularization is a technique that may be used to achieve such ends. When modularizing, components or circuits of a device are segregated into modules based on one or more underlying criteria. It will be appreciated that, as a complex electronic device comprised of a myriad of circuits, there are potentially numerous ways to modularize a feedforward multicarrier linear RF power amplifier. For example, modularization can be based on segregating components that generate noise from components that are sensitive to noise, or segregating components that generate heat from non heat-generating components, or segregating components requiring access for initial or periodic adjustment from those that do not, or segregating components based on weight or size considerations, to mention just a few.

Such varied approaches will yield varied results in terms of the utility of the modularized amplifier. A desirable approach is one that reduces the cost of designing and manufacturing the amplifier, that reduces the time to deliver the amplifier for a specific service, and one that simplifies field servicing of the amplifier.

SUMMARY OF THE INVENTION

In accordance with the illustrative embodiments of the present invention, an improved feedforward multicarrier linear RF power amplifier ("FMLRF power amp") advantageously comprises several modules. Each of such modules contains a portion of the circuitry of a conventional MLRF power amp.

In some embodiments, the circuitry of a standard FMLRF power amp has advantageously been partitioned into modules such that: (1) high power components are segregated from low power components; and (2) components operating within a narrow frequency range are segregated from those having broadband frequency operation. Additionally, the circuitry is advantageously partitioned to result in a few simple RF interfaces between the modules.

Segregating the circuitry of a conventional FMLRF power amp to satisfy the above-listed criteria advantageously results, in some embodiments, in an improved FMLRF power amp having three modules including: (i) a RF power module; (ii) a linearizer module; and (iii) a DC power supply module.

The RF power module primarily contains amplification circuitry. Such circuitry is operating frequency dependent and, of course, dependent on the desired RF output power level. The design of the RF power module may vary from amplifier to amplifier as a function of the operating frequency requirements (a range defined, collectively, by the frequency of each of the RF carrier signals in use within a cell) and the output power requirements for a given application.

The linearizer module contains broadband low-power level RF circuits and control circuits. Such circuitry is substantially operating-frequency and power-level independent. In contrast to the RF power module, the linearizer module will not vary from amplifier to amplifier. In other words, it contains "generic" circuitry such that a single design suffices for substantially any application. The DC power supply module supplies power to the FMLRF power amp. It is not required when an external power supply is available. The DC power supply module contains power-level dependent but frequency-independent components. The DC power supply does not vary from amplifier to amplifier unless there is a substantial change in RF output power level between such amplifiers.

An improved FMLRF power amp in accordance with the illustrated embodiments advantageously reduces design cost, time to market and manufacturing cost of a FMLRF power amplifier. In accordance with the illustrated embodiments, new FMLRF power amps can be "designed" and "manufactured" by simply selecting "off-the-shelf" modules where appropriate. Where such off-the-shelf modules are not suitable because, for example, of a variance in RF power output requirements, a new RF power module design may be all that is required. The necessity of a designing a new linearizer module, which is the most difficult circuitry of the amplifier to design and manufacture, is usually avoided.

DETAILED DESCRIPTION

Figure 3:
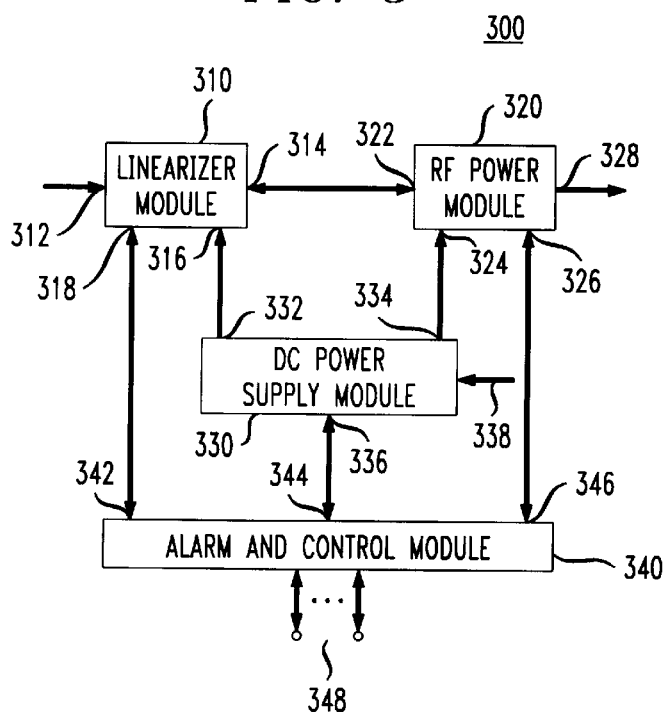
FIG. 3 depicts an illustrative embodiment of the present invention wherein a feedforward multicarrier linear RF amplifier is modularly partitioned.

FIG. 3 depicts a schematic diagram of an illustrative embodiment of the present invention, wherein FMLRF power amp 300 is advantageously partitioned into modules by segregating circuitry and components according to at least the following two criteria. First, high power circuitry and components are segregated from low power circuitry and components. And second, narrow (frequency) band circuits and components are segregated from broadband circuits and components. Additionally, the modules resulting from the segregation of circuitry and components must be interconnectable by a few simply-implemented interfaces.

Segregating the circuitry and components of a FMLRF power amp according to the above guidelines advantageously results, in some embodiments, in four modules. The four modules include linearizer module 310, RF power module 320, DC power supply module 330 and alarm and control module 340.

A primary function of the circuitry within linearizer module 310 is to attenuate distortion generated by the main amplifier (component 208 in FIG. 2) within RF power module 320. Linearizer module 310 contains broadband, low power circuitry and components. Linearizer module 310 includes splitters 202 and 220, gain & phase control circuitry 204, 224, delay circuitry 210, coupler 216 and processor control circuitry 212 (see FIG. 2). Such circuitry and components are substantially power independent in the sense that a single design suffices regardless of amplifier output power. Moreover, such circuitry and components are substantially frequency independent in the sense that their broadband operating frequency range overlaps that of substantially any likely RF carrier frequency. In view of the power level and frequency range independence of the components and circuits contained within linearizer module 310, a single design of linearizer module 310 may be advantageously used for most applications.

Figure 1:
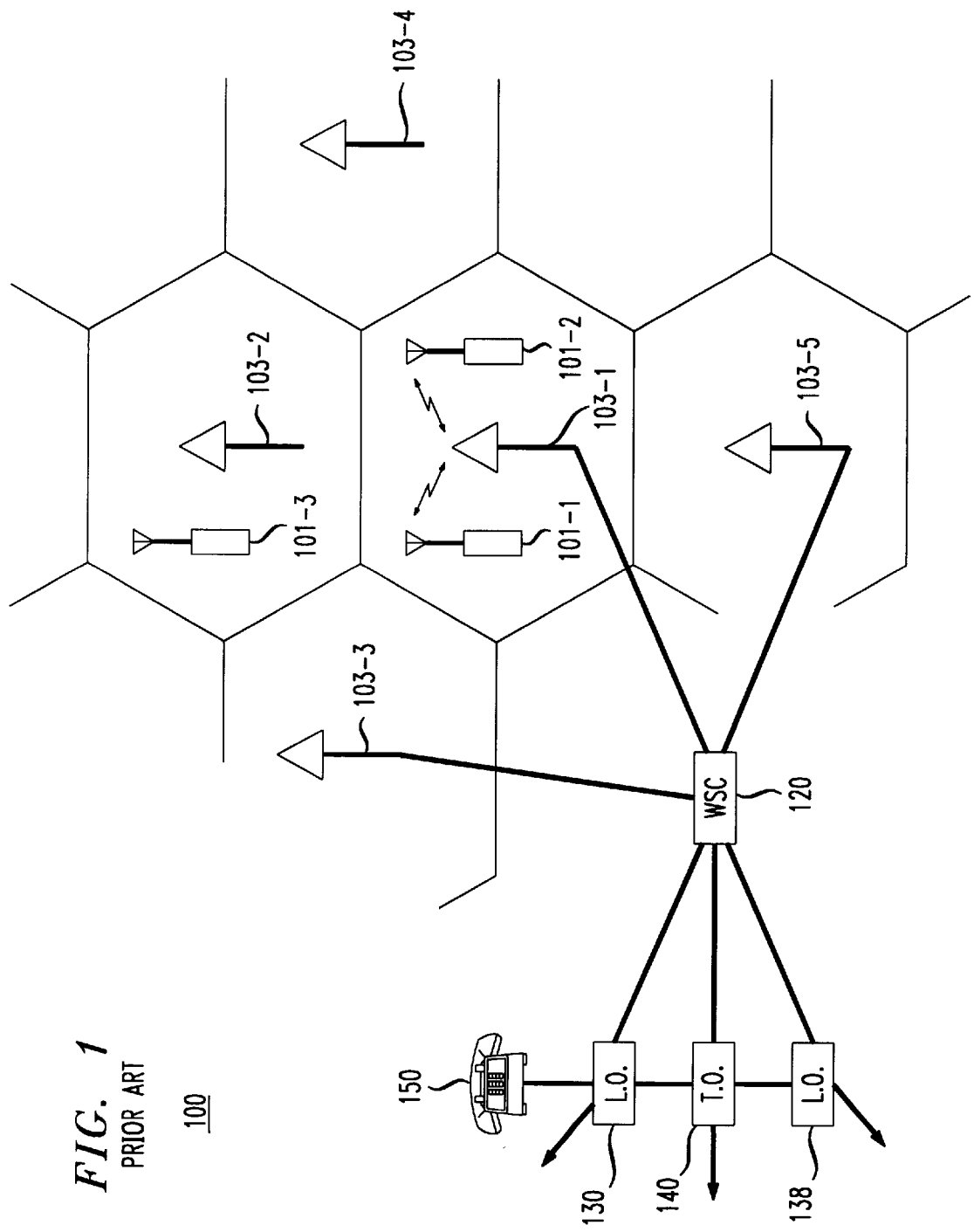
FIG. 1 depicts a schematic diagram of a prior art wireless telecommunication system.
Figure 2:
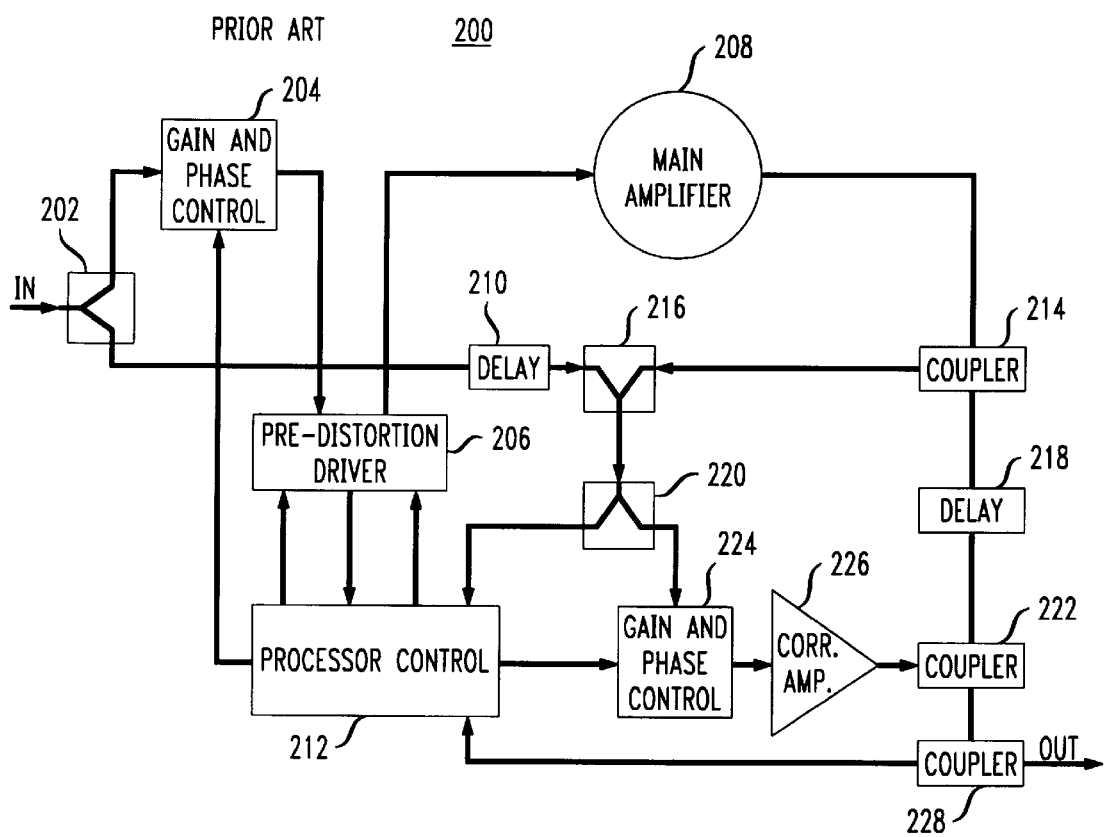
FIG. 2 depicts a schematic diagram of a prior art linear amplifier circuit.

In the illustrated embodiment, linearizer module 310 advantageously includes port 312 for receiving an RF input signal, interface 314 for receiving a portion of an amplified signal from RF power module 320 and for delivering a signal thereto, interface 316 for receiving power from DC power supply 330 and interface 318 for electrical connection with alarm and control module 340. With reference to FIG. 2, interface 314 receives: (i) a first signal from coupler 214 (in RF power module 320) and delivers it to splitter 216, and (ii) a second signal from coupler 228 (in RF power module 320) and delivers it to processor control 212. Additionally, interface 314 delivers: (i) a third signal from gain & phase control 204 to pre-distortion driver 206 (in RF power module 320), and (ii) a fourth signal from gain & phase control 224 to correction amplifier 226 (in RF power module 320).

A primary function of circuitry within RF power module 320 is to amplify the RF input signal after it is processed in linearizer module 310. RF power module 320 contains narrow frequency band, high power circuitry and components. RF power module 320 includes pre-distortion driver 206, amplifier 208, couplers 214, 222, 228, delay circuitry 218 and correction amplifier 226 (see FIG. 2). Unlike the circuitry and components in linearizer module 310, circuitry and components in the RF power module are substantially power dependent in the sense that module design varies as a function of desired amplifier output power. Moreover, such circuitry and components are substantially frequency dependent in the sense that due to their relatively narrow range in operating frequency, design changes may be required with each application (e.g., use within a different base station).

In the illustrated embodiment, RF power module 320 advantageously includes interface 322 for sending a portion of the amplified RF signal to linearizer module 310, interface 324 for receiving power from DC power supply 330, interface 326 for electrical connection with alarm and control module 340 and port 328 for delivering the amplified RF signal to an antenna for transmission.

DC power supply module 330 provides power to linearizer module 310, RF power module 320 and alarm and control module 340. Circuitry and components within DC power supply module 330 are somewhat dependent upon the output power of RF power module 320, but substantially frequency independent. Large changes in amplifier output power may require a change in the design of the DC power supply module. In the illustrated embodiment, DC power supply module 330 advantageously includes interfaces 332, 334 and 336 for supplying power to the other modules. External power input 338 supplies power to DC power supply module 330. For applications in which an external power supply is available, DC power supply module 330 is not required. Those familiar with the design of multicarrier linear RF power amplifiers will be able to construct a DC power supply module in accordance with the present teachings.

Alarm and control module 340 monitors desired systems within FMLRF power amp 300. In some embodiments, the alarm and control module is programmable to accommodate changes in monitoring requirements. In embodiments having minimal monitoring requirements, alarm and control module 340 may not required. The alarm and control module includes power and frequency insensitive components. As such, module design does not vary with amplifier requirements. In some embodiments, the circuitry and components comprising alarm and control module 340 can be incorporated in linearizer module 310. Such incorporation is consistent within the above-described partitioning criteria (i.e., the circuitry of both the linearizer and the alarm and control module is independent of amplifier output power and operating frequency).

In the illustrated embodiment, alarm and control module 340 advantageously includes interface 342 in electrical connection with interface 318 on the linearizer module, interface 344 in electrical connection with interface 336 on the DC power supply module and interface 346 in electrical connection with interface 326 of the RF power module. Such interfaces allow alarm and control module 340 to monitor conditions within the various modules and take appropriate actions (e.g., shutdown, etc.). Alarm and control module 340 further advantageously includes external interfaces 348 for monitoring system conditions external to the other modules. Those familiar with the design of multicarrier linear RF power amplifiers will be able to construct an alarm and control module in accordance with the present teachings.

Partitioning the FMLRF power amp 300 as described above advantageously reduces the cost and time to design and manufacture an amplifier for a given application. For some applications, design and manufacture of a FMLRF power amp reduces to the simple act of selecting, if available, an off-the-shelf RF power module having the desired output power. As previously noted, the linearizer module and alarm and control module design are substantially invariant; a single design being suitable for most applications. Only a few DC power supply module designs should suffice for a broad range of RF power module designs. If required, a RF power module can be rapidly designed and manufactured relative to the time required for the design and manufacture of a conventional feedforward multicarrier linear RF power amplifier.

Figure 4:
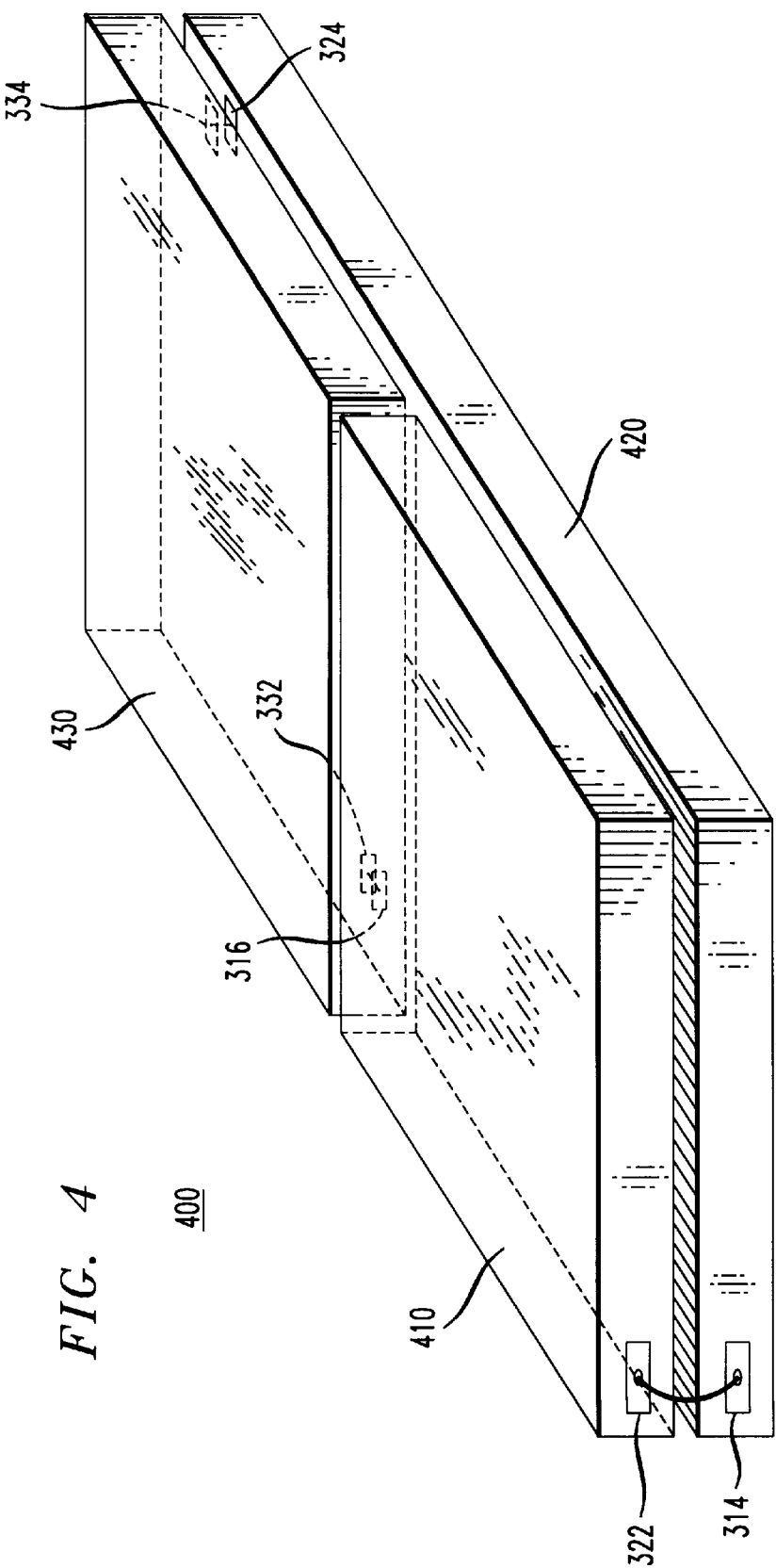
FIG. 4 depicts a perspective view of a feedforward multicarrier linear RF amplifier in accordance with the illustrative embodiment of the present invention.

FIG. 4 depicts a perspective view of interconnected modules of an illustrative embodiment of the present invention. In the embodiment shown in FIG. 4, a FMLRF 400 comprises three modules, including linearizer module 410, RF power module 420 and DC power supply module 430. The alarm and control module circuitry, not shown, is included in linearizer module 410. Linearizer module 410 and RF power module 420 are electrically connected at interfaces 314 and 322. The linearizer module is electrically connected to DC power supply module 430 at interfaces 316 and 332. And the RF power module is electrically connected to the DC power supply module at interfaces 324 and 334. The module enclosures are advantageously formed of metal to provide shielding to circuits and components therein.

Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention. It is therefore intended that such other arrangements be included within the scope of the following claims and their equivalents.

What is claimed is:

1. A modularly-partitioned feedforward multicarrier linear RF power amplifier comprising:

a RF power module electrically connected to a linearizer module, wherein, the RF power module comprises an RF power module enclosure and is operable to amplify a RF carrier signal processed in the linearizer module and the linearizer module comprises a linearizer module enclosure and is operable to attenuate distortion caused during amplification of the RF carrier signal in the RF power module; and further wherein, the RF power module comprises relatively narrow-frequency band and high-power circuitry and components that are contained within said RF power module enclosure, which frequency band and power is dictated, respectively, by RF carrier frequency and RF output power requirements for the feedforward multicarrier linear RF power amplifier, and the linearizer module comprises relatively broad-frequency band and low-power circuitry and components that are contained within said linearizer module enclosure and that are, effectively, substantially independent of RF carrier frequency and RF output power requirements.

2. The power amplifier of claim 1, and further comprising a DC power supply module electrically connected to the RF power module and the linearizer module and operable to supply power to those modules, wherein the DC power supply module is comprised of circuitry and components that are contained within a DC power module enclosure and that are, effectively, substantially independent of RF carrier frequency and dependent on RF output power requirements.

3. The power amplifier of claim 1, and further comprising an alarm and control module electrically connected to the RF power module and the linearizer module and operable to monitor circuits therein, wherein the alarm and control module is comprised of circuitry and components that are contained with an alarm and control module enclosure and that are, effectively, substantially independent of RF carrier frequency and RF output power requirements.

4. The power amplifier of claim 1, wherein, a first coupler receiving output from a main amplifier within the RF power module is electrically connected to a splitter within the linearizer module, and a second coupler within the RF power module is electrically connected to a processor control circuit within the linearizer module, and a first gain & phase control in the linearizer module is electrically connected to a pre-distortion driver circuit within the RF power module, and a second gain & phase control circuit in the linearizer module is electrically connected to a correction amplifier in the RF power module.

5. The amplifier of claim 1, wherein said linearizer module enclosure abuts said RF power module enclosure.

6. The amplifier of claim 2, wherein said DC power module enclosure abuts said RF power module enclosure.

7. The amplifier of claim 2, wherein said DC power module enclosure abuts said linearizer power module enclosure.

8. A modularly-partitioned feedforward multicarrier linear RF power amplifier comprising:

a RF power module operable to amplify a RF carrier signal, wherein, the RF power module is comprised of relatively narrow-frequency band and high-power circuitry and components that are contained within an RF power module enclosure, and further wherein the frequency band and power of the circuitry and components is dictated, respectively, by RF carrier frequency and RF output power requirements; and a linearizer module electrically connected to the RF power module, which linearizer module is operable to attenuate distortion caused during amplification of the RF carrier signal in the RF power module, wherein, circuitry and components comprising the linearizer module are contained within a linearizer module enclosure and that are substantially independent of RF carrier frequency and RF output power requirements.

9. The power amplifier of claim 8, wherein, the circuitry and components of the RF power module comprise: a pre-distortion driver electrically connected to a main amplifier, which main amplifier is also electrically connected to a first coupler that is also electrically connected to a first delay circuit, which first delay circuit is further electrically connected to a second coupler that is also electrically connected to a correction amplifier and a third coupler; and, wherein, the circuitry and components of the linearizer module comprise a first splitter for receiving the RF carrier signal that is electrically connected to a first gain and phase control circuit and a second delay circuit, which second delay circuit is also electrically connected to a second splitter that is also electrically connected to a third splitter, which third splitter is further electrically connected to processor control circuitry and a second gain and phase control circuit, and wherein the processor control circuitry is also electrically connected to the first and second gain and phase control circuits.

10. The power amplifier of claim 9, wherein the electrical connection between the linearizer module and the RF power module comprises:

a first electrical connection between an output of the first gain and phase control circuit in the linearizer module and a first input of the pre-distortion driver in the RF power module;

a second electrical connection between at least a first output of the processor control circuit in the linearizer module and a second input of the pre-distortion driver in the RF power module;

a third electrical connection between a first output of the pre-distortion driver in the RF power module and a first input of the processor control circuit in the linearizer module;

a fourth electrical connection between a first output of the third coupler in the RF power module and a second input of the processor control circuit in the linearizer module;

a fifth electrical connection between a first output of the second gain and phase control circuit in the linearizer module and an input of the correction amplifier in the RF power module; and a sixth electrical connection between an output of the first coupler of the RF power module and an input of the second splitter in the linearizer module.

11. The amplifier of claim 8, wherein said linearizer module enclosure abuts said RF power module enclosure.

12. A modularly-partitioned multicarrier linear RF power amplifier for amplifying a multicarrier RF signal, comprising:

a linearizer module operable to attenuate distortion caused during amplification of the multicarrier RF signal, wherein, circuitry and components comprising the linearizer module are contained within a linear module enclosure and that are substantially independent of RF carrier frequency and RF output power requirements; and a first interface operable to electrically connect the linearizer module to a RF power module that is contained within a RF power module enclosure and that is suitable for amplifying the multicarrier RF signal.

13. The modularly-partitioned multicarrier linear RF power amplifier of claim 12, and further comprising:

the RF power module electrically connected to the first interface, wherein the RF power module is comprised of relatively narrow-frequency band and high-power circuitry and components that are contained within said RF power module enclosure, and further wherein the frequency band and power of the circuitry and components is dictated, respectively, by RF carrier frequency and RF output power requirements.

14. The modularly-partitioned multicarrier linear RF power amplifier of claim 13, and further comprising:

a second interface operable to electrically connect the linearizer module to a DC power supply module contained in a DC power supply module enclosure.

15. The modularly-partitioned multicarrier linear RF power amplifier of claim 14, and further comprising:

the DC power supply module electrically connected to the second interface, wherein the DC power supply module is operable to supply power to the linearizer module, and further wherein the DC power supply module is comprised of circuitry and components that are contained within said DC power supply module enclosure and that are substantially independent of RF carrier frequency and dependent on RF output power requirements.

16. The amplifier of claim 13, wherein said linearizer module enclosure abuts said RF power module enclosure.

17. The amplifier of claim 15, wherein said DC power module enclosure abuts said RF power module enclosure.

18. The amplifier of claim 15, wherein said DC power module enclosure abuts said linearizer module enclosure.

19. A method of making a modularly-partitioned feedforward multicarrier linear RF power amplifier, comprising the steps of:

segregating circuitry and components operable for amplifying a multicarrier RF signal with a first amount of distortion into a first module comprising a first module enclosure containing relatively narrow-frequency band and high-power circuitry and components operable to amplify a multicarrier RF signal with a second amount of distortion that is greater than the first amount; and a second module comprising a second module enclosure containing relatively broad-frequency band and low-power circuitry and components, wherein the second module is operable to attenuate distortion caused during amplification of the multicarrier RF carrier signal in the first module; and electrically connecting the modules so that, when the modules are provided with power, they are operable, collectively, to amplify the multicarrier RF signal with the first amount of distortion.

20. The method of claim 19, and further comprising the step of electrically connecting the first module and the second module to a power supply.

21. The method of claim 13 wherein the step of electrically connecting the first and second modules to a power supply further comprises electrically connecting the first and second module to a third module comprising a DC power supply that is contained within a third module enclosure.

22. The method of claim 19, and further comprising placing said first module enclosure and said second module enclosure in abutting relation.

23. The method of claim 21, and further comprising placing said third module enclosure and said first module enclosure in abutting relation.

24. The method of claim 21, and further comprising placing said third module enclosure and said second module enclosure in abutting relation.

25. A base station for a wireless telecommunications system, comprising:
- a plurality of radios for modulating information onto a plurality of RF carrier signals;
- a modularly-partitioned feedforward multicarrier linear RF power amplifier for amplifying a multicarrier RF signal comprised of the plurality of modulated RF carrier signals, the amplifier comprising:
  - a RF power module electrically connected to a linearizer module, wherein, the RF power module is operable to amplify the multicarrier RF signal and the linearizer module is operable to attenuate distortion caused during amplification of the multicarrier RF signal in the RF-power module; and further wherein,
  - the RF power module is comprised of relatively narrow-frequency band and high-power circuitry and components that are contained within a RF power module enclosure, which frequency band and power is dictated, respectively, by RF carrier frequency and RF-output power requirements for the feedforward multicarrier linear RF power amplifier, and
  - the linearizer module is comprised of relatively broad-frequency band and low-power circuitry and components that are contained within a linearizer module enclosure and that are substantially independent of RF carrier frequency and RF-output power requirements; and
- an antenna for transmitting the amplified multicarrier RF signal.

26. The base station of claim 25, wherein said linearizer module enclosure abuts said RF power module enclosure.

* * * * *